(12) United States Patent
Kim et al.

(10) Patent No.: US 10,356,293 B2
(45) Date of Patent: Jul. 16, 2019

(54) IMAGE SENSOR HAVING OUTER AND INNER ADDRESS MARKERS

(71) Applicant: SK hynix Inc., Gyeonggi-do (KR)

(72) Inventors: Jong Eun Kim, Gyeonggi-do (KR); Namil Kim, Gyeonggi-do (KR); Dae-Woo Kim, Gyeonggi-do (KR); Changsu Park, Gyeonggi-do (KR); Dong-Hyun Woo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 159 days.

(21) Appl. No.: 15/251,948

(22) Filed: Aug. 30, 2016

(65) Prior Publication Data

US 2017/0310859 A1 Oct. 26, 2017

(30) Foreign Application Priority Data

Apr. 25, 2016 (KR) .................. 10-2016-0050027

(51) Int. Cl.
*H04N 5/225* (2006.01)
*H01L 27/146* (2006.01)
*H01L 27/148* (2006.01)

(52) U.S. Cl.
CPC ..... *H04N 5/2253* (2013.01); *H01L 27/14603* (2013.01); *H01L 27/14812* (2013.01)

(58) Field of Classification Search
CPC .................. H01L 27/14603; H01L 27/14812
See application file for complete search history.

(56) References Cited

U.S. PATENT DOCUMENTS

| | | | | |
|---|---|---|---|---|
| 5,300,942 A * | 4/1994 | Dolgoff | ............. | G02F 1/133382 345/32 |
| 6,597,427 B1 * | 7/2003 | Katsu | .................. | G02F 1/13338 349/192 |
| 6,734,931 B2 * | 5/2004 | Yu | ..................... | G02F 1/133514 349/106 |
| 7,393,130 B2 | 7/2008 | Hasei | | |
| 9,122,349 B1 * | 9/2015 | Chang | .................. | G09G 3/3413 |
| 9,134,527 B2 * | 9/2015 | Lee | ...................... | B81B 7/0006 |
| 9,423,910 B2 * | 8/2016 | Seo | ........................ | G06F 3/0418 |
| 2008/0205238 A1 * | 8/2008 | Hwang | ................ | G11B 7/0065 369/103 |
| 2009/0244416 A1 * | 10/2009 | Liao | .................. | G02F 1/136286 349/38 |
| 2013/0235243 A1 * | 9/2013 | Sano | ..................... | H04N 5/374 348/308 |
| 2015/0370113 A1 * | 12/2015 | Kim | .................... | G02F 1/13336 361/679.21 |
| 2017/0294417 A1 * | 10/2017 | Edmond | ............. | H01L 25/0753 |

\* cited by examiner

*Primary Examiner* — Eugene Lee
(74) *Attorney, Agent, or Firm* — IP & T Group LLP

(57) ABSTRACT

Provided is an image sensor having a pixel region including a plurality of pixel blocks disposed in a matrix form, outer address markers around the pixel region, interspaces between the plurality of pixel blocks, and inner address markers disposed in the interspaces.

13 Claims, 16 Drawing Sheets

IMAGE SENSOR HAVING OUTER AND INNER ADDRESS MARKERS

CROSS-REFERENCE TO RELATED APPLICATIONS

The present application claims priority to Korean Patent Application No. 10-2016-0050027, filed on Apr. 25, 2016, which is herein incorporated by reference in its entirety.

BACKGROUND

1. Field

Exemplary embodiments of the inventive concepts relate to image sensors having various address markers.

2. Description of the Related Art

An image sensor is a device that converts an optical image into an electrical signal. Recently, with the development of a computer industry and a communication industry, there are increased demands for an image sensor having an improved integration degree and performance in various fields such as digital cameras, camcorders, PCSs (Personal Communication Systems), game machines, security cameras, medicine micro cameras, and robots. Recently, a technology to perform auto-focusing by sensing a phase difference of light has been spotlighted.

In order to inspect defects and failed pixels in a fabrication process of a pixel array of an image sensor, address markers which designate the positions of each pixel are required. Particularly, in the case of inspecting failed pixels by using naked eyes, an optical microscope, or an electron microscope, a reference point or a reference address marker is required to easily find the position of a specific pixel.

SUMMARY

Various embodiments of the inventive concepts provide image sensors having outer address markers and inner address markers.

An image sensor in accordance with one embodiment may include an active layer including pixel blocks and an interspace, an outer active address marker located outside the active layer, and an inner active address marker located in the active layer and in the interspace. The pixel blocks may be arranged in a matrix form. The interspace may be provided between the pixel blocks.

The interspace may include a vertical interspace and a horizontal interspace. The vertical interspace may vertically extend through the active layer. The horizontal interspace may horizontally extend through the active layer.

The inner active address marker may include an inner active block address marker and an inner active pixel address marker. The inner active block address marker may be located at an intersection of the vertical interspace and the horizontal interspace. The inner active pixel address marker may be located at least one of at the vertical interspace or the horizontal interspace. The inner block address marker may have an STI shape.

The image sensor may further include a gate layer formed over the active layer and including a gate pattern, an inner gate block address marker formed in the gate layer and aligned with the inner active block address marker, and an inner gate pixel address marker formed in the gate layer and aligned with the inner active pixel address marker. Each of the inner gate block address marker and the inner gate pixel address marker may be located at the same level as the gate pattern.

The image sensor may further include a metal layer formed over the active layer and including a metal pattern, an inner metal block address marker formed in the metal layer and aligned with the inner active block address marker, and an inner metal pixel address marker formed in the metal layer and aligned with the inner active pixel address marker. Each of the inner metal block address marker and the inner metal pixel address marker may be located at the same level as the metal pattern.

The image sensor may further include a micro-lens layer formed over the active layer and including a pattern region and a non-pattern region, and micro-lenses disposed in the pattern region in a matrix form. The non-pattern region may include an outer non-pattern region and an inner non-pattern region. The outer non-pattern region may be aligned with the outer active address marker. The inner non-pattern region may be aligned with the inner active address marker.

The image sensor may further include a color filter layer formed between the micro-lens layer and the active layer and including a filter region and non-filter region, and color filters disposed on the filter region in a matrix form and are not disposed on the non-filter region. The non-filter region may include an outer non-filter region and an inner non-filter region. The outer non-filter region may be aligned with the outer non-pattern region and the outer address marker. The inner non-filter region may be aligned with the inner non-pattern region and the inner address marker.

An image sensor in accordance with one embodiment may include a pixel array including an active layer, a gate layer, a metal layer, and a microlens layer and the pixel array may include pixel blocks and interspaces between the pixel blocks. The image sensor may include address markers disposed in the interspaces.

The active layer may include an active region and a shallow trench isolation (STI) pattern disposed in a substrate. The address markers may include active address markers disposed in the substrate. The shallow trench isolation (STI) pattern and the active address markers may be disposed at the same level.

The gate layer may include gate patterns. The address markers may include gate address markers. The gate patterns and the gate address markers may be disposed at substantially the same level.

The metal layer may include metal patterns. The address markers may include metal address markers. The metal patterns and the metal address markers may be disposed at substantially the same level.

The microlens layer may include microlenses. The microlens layer may include a non-pattern region in which the microlenses are not disposed. The interspaces and the non-pattern region may be vertically aligned.

An image sensor in accordance with one embodiment may include pixel blocks and interspaces between the pixel blocks; an active region, a shallow trench isolation (STI) region, a gate pattern, a metal pattern, and microlenses disposed in the pixel blocks; outer address markers around the pixel blocks; and inner address markers disposed in the interspaces.

The inner address markers may include inner active address markers, inner gate address markers, and inner metal address markers vertically aligned with one another.

The outer address markers may include outer active address markers, outer gate address markers, and outer metal address markers vertically aligned with one another.

The image sensor may further include an inner non-pattern region which is not vertically aligned with the inner active address markers, the inner gate address markers, and the inner metal address markers and from which the microlenses have been removed.

The image sensor may further include an outer non-pattern region which is not vertically aligned with the outer active address markers, the outer gate address markers, and the outer metal address markers and from which the microlenses have been removed.

In accordance with the technical scope of the present embodiments, address markers are disposed in a pixel array, so that it is possible to find and inspect pixels at specific positions in a short time.

In accordance with the technical scope of the present embodiments, a time consumed to inspect an image sensor is shortened, so that it is possible to improve the productivity of the image sensor.

DETAILED DESCRIPTION

Figure 1:
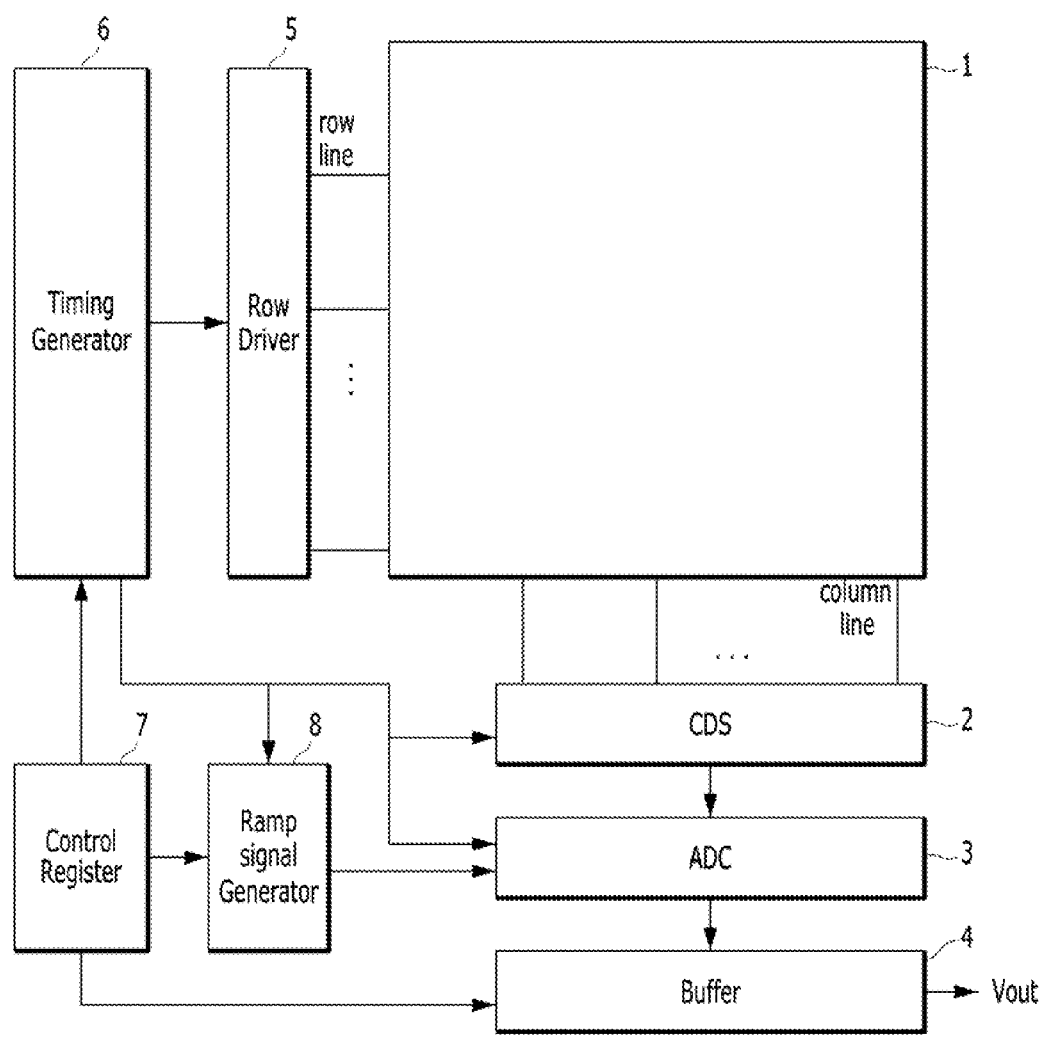
FIG. 1 is a block diagram schematically illustrating an image sensor in accordance with an embodiment of the inventive concepts.

Various embodiments of the inventive concepts will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. Throughout the disclosure, like reference numerals refer to like parts throughout the various figures and embodiments of the inventive concepts.

FIG. 1 is a block diagram schematically illustrating an image sensor in accordance with an embodiment of the inventive concepts. Referring to FIG. 1, the image sensor in accordance with an embodiment of the inventive concepts may include a pixel array 1, a correlated double sampler (CDS) 2, an analog-to-digital converter (ADC) 3, a buffer 4, a row driver 5, a timing generator 6, a control register 7, and a ramp signal generator 8.

The pixel array 1 may include a plurality of pixels disposed in a matrix structure. The plurality of pixels may convert optical image information into an electrical image signal and transmit the electrical image signal to the CDS 2 through column lines. Each of the pixels may be coupled to one of row lines and one of column lines, respectively.

The CDS 2 may hold and sample the electrical image signals received from the pixels of the pixel array 1. For example, the CDS 2 may sample a reference voltage level and voltage levels of the received electrical image signals according to a clock signal provided from the timing generator 6, generate an analog signal corresponding to the difference thereof, and transmit the analog signal to the ADC 3.

The ADC 3 may convert the received analog signal into a digital signal and transmit the digital signal to the buffer 4. The buffer 4 may latch the received digital signal and sequentially output the latched signal to an external video signal processor. The buffer 4 may include a memory to latch the digital signal and a sense amplifier to amplify the digital signal.

The row driver 5 may drive the pixels of the pixel array 1 according to a signal of the timing generator 6. For example, the row driver 5 may generate driving signals to selectively drive one of the row lines.

The timing generator 6 may generate a timing signal to control the CDS 2, the ADC 3, the row driver 5, and the ramp signal generator 8.

The control register 7 may generate control signals to control the buffer 4, the timing generator 6, and the ramp signal generator 8.

The ramp signal generator 8 may generate a ramp signal to control an image signal, which is outputted from the buffer 4, under the control of the timing generator 6.

FIG. 2A to FIG. 2F are conceptual layouts of pixel arrays 1A to 1F of image sensors in accordance with various embodiments of the inventive concepts.

Referring to FIG. 2A to FIG. 2F, each of the pixel arrays 1A to 1F of the image sensors in accordance with various embodiments of the inventive concepts may include a pixel region 10 having a plurality of pixel blocks 15, outer address markers 30 around the plurality of pixel blocks 15, and inner address markers 40 between the plurality of pixel blocks 15. The pixel arrays 1A to 1F may include N×M pixel blocks 15, where N and M are integers. For example, in each of the pixel arrays 1A to 1F, each of the pixel blocks 15 has an 8×4 pixel arrangement. In some embodiments, the pixel arrays 1A to 1F may include a pixel block 15 which is larger than 8×4.

The outer address markers 30 may indicate start positions and/or end positions of the pixel blocks 15, and specific positions of the pixel blocks 15. The outer address markers 30 may indicate positions of the 10th pixel, the 50th pixel, the 64th pixel, the 100th pixel, the 128th pixel, the 200th pixel, the 256th pixel, the 300th pixel, the 400th pixel, the 500th pixel, the 512th pixel, the 1000 pixel, or the 1024th pixel. In another embodiment, the outer address markers 30 may indicate a position of a specific order number of a pixel. The outer address markers 30 may have a cross, bar, segment, or block shape. The outer address markers 30 may have various sizes, widths, or lengths.

Figure 2A:
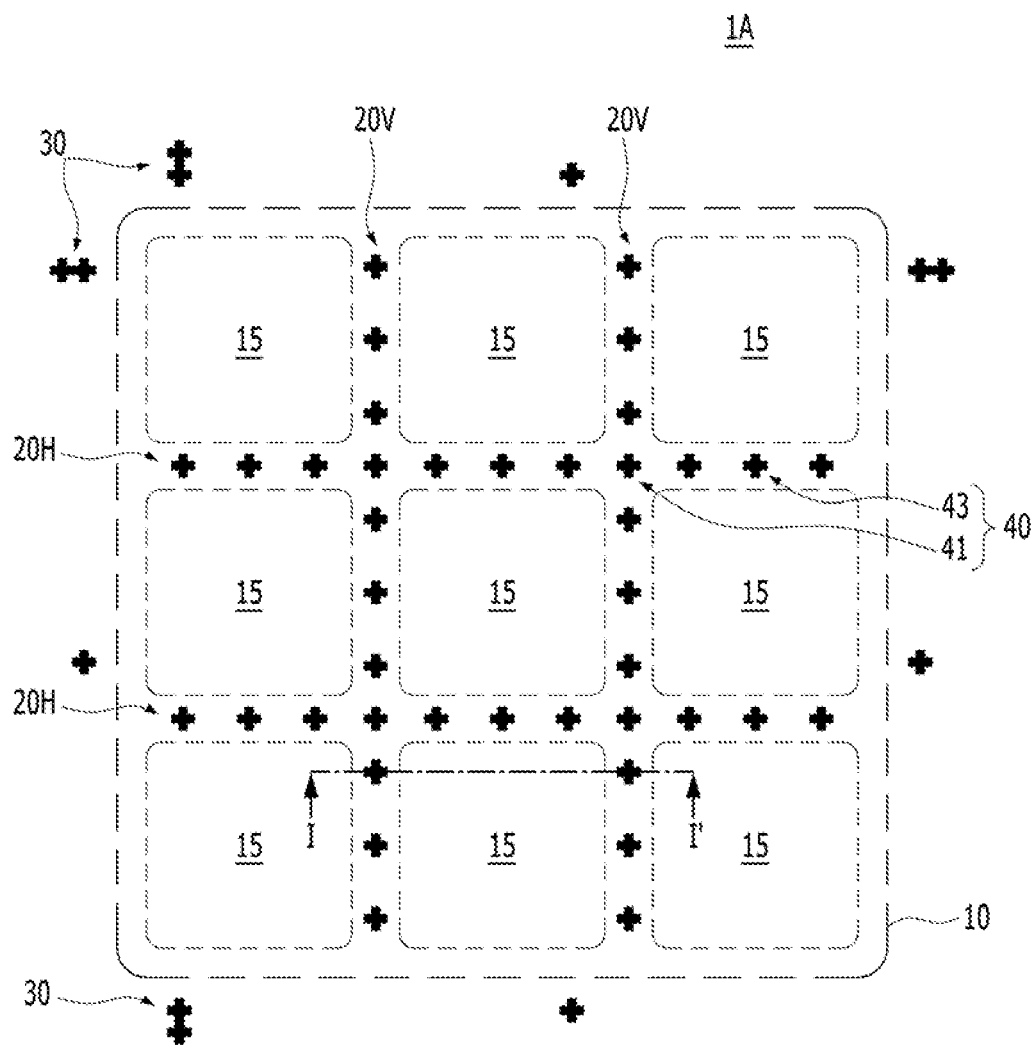
FIG. 2A to FIG. 2F are schematic layouts of pixel arrays of image sensors in accordance with various embodiments of the inventive concepts.

Referring to FIG. 2A, the inner address markers 40 in accordance with one embodiment of the inventive concepts may include inner block address markers 41 and inner pixel address markers 43 which are disposed in interspaces 20V and 20H extending between the pixel blocks 15 to distinguish the pixel blocks 15 from one another. The interspaces 20V and 20H may include vertical interspaces 20V which vertically extend and horizontal interspaces 20H which horizontally extend. Specifically, the inner block address markers 41 may be disposed at intersections of the vertical interspaces 20V and the horizontal interspaces 20H, and the inner pixel address markers 43 may be disposed in the vertical interspaces 20V or the horizontal interspaces 20H. Each of the inner block address markers 41 may have a cross shape.

Figure 2B:
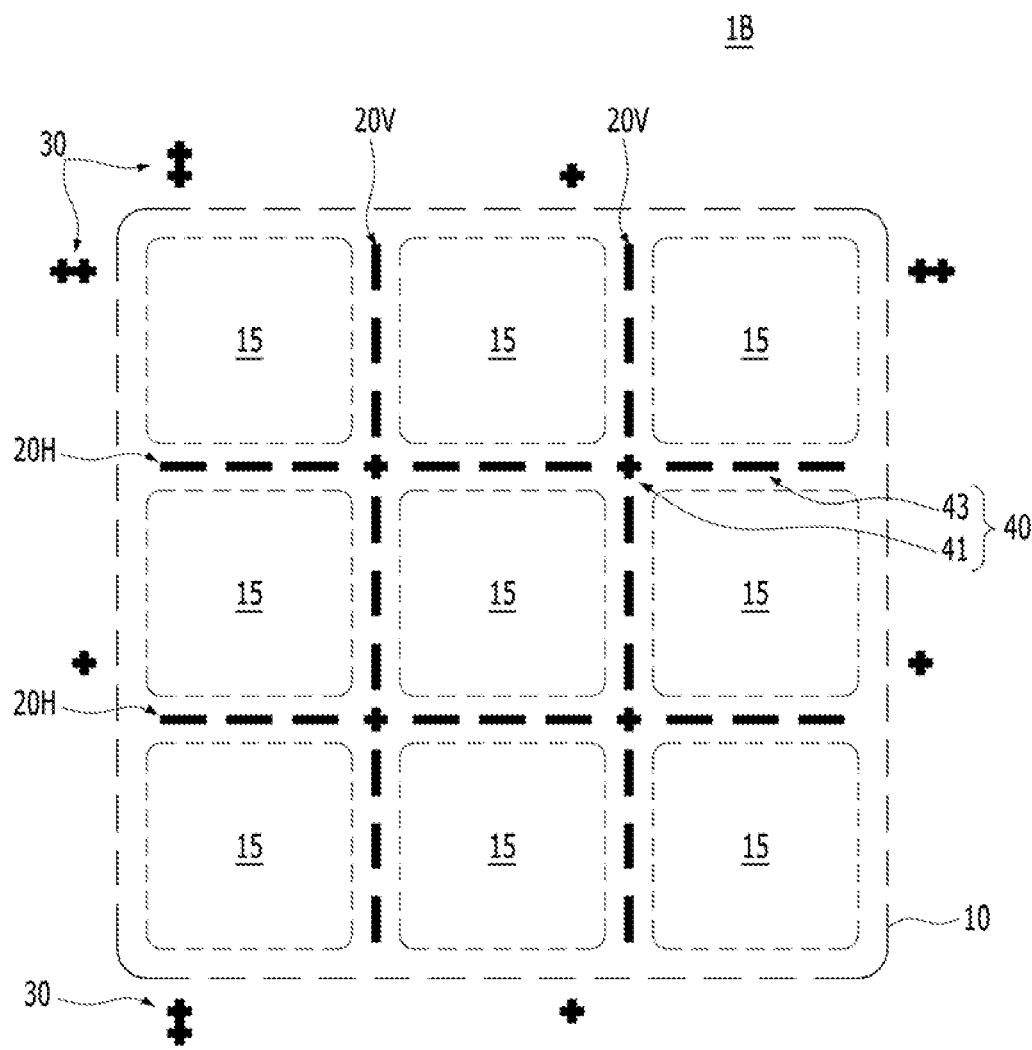

Referring to FIG. 2B, the inner address markers 40 in accordance with an embodiment of the inventive concepts may include inner block address markers 41 having a cross shape and inner pixel address markers 43 having a discrete bar shape.

Figure 2C:
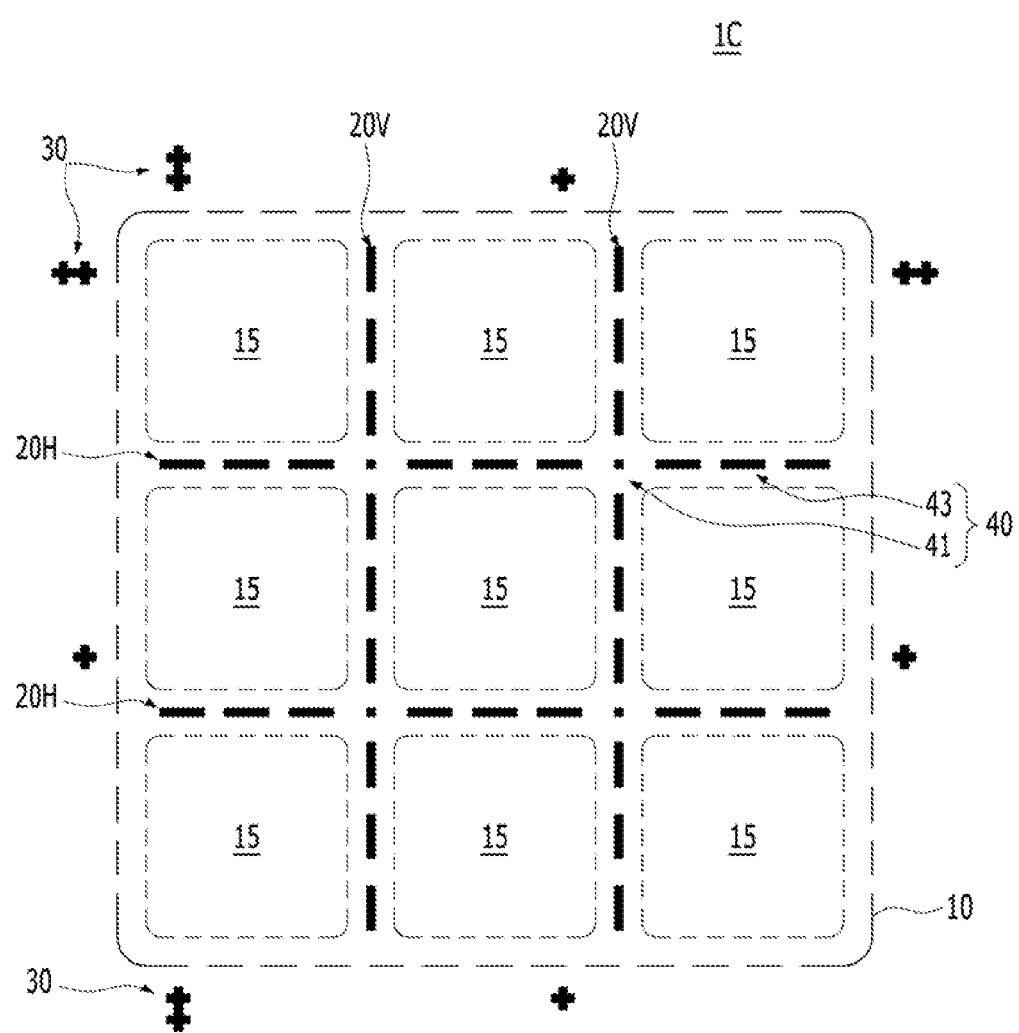

Referring to FIG. 2C, the inner address markers 40 in accordance with one embodiment of the inventive concepts may include inner block address markers 41 having a dot or block shape and inner pixel address markers 43 having a discrete bar shape.

Figure 2D:
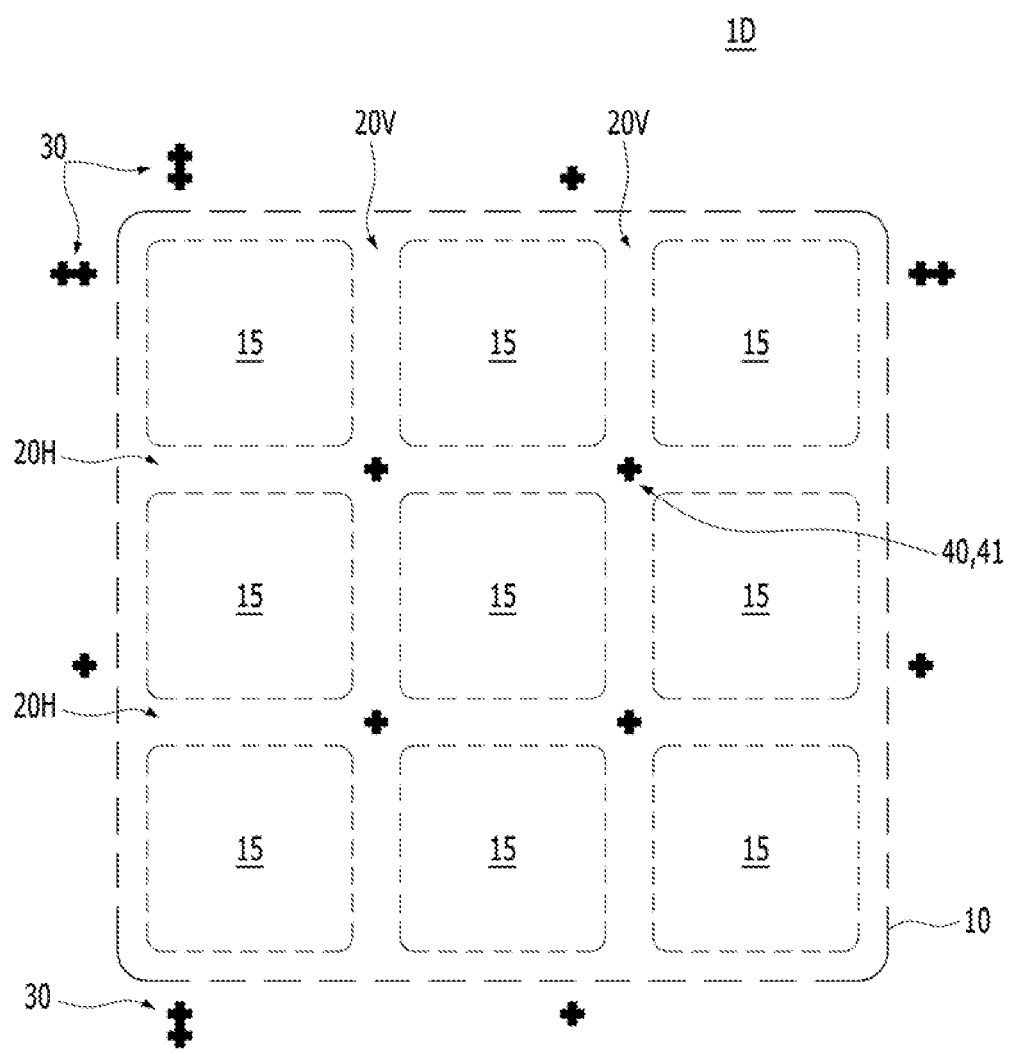

Referring to FIG. 2D, the inner address markers 40 in accordance with one embodiment of the inventive concepts may include only inner block address markers 41 having a cross shape. For example, the inner pixel address markers 43 illustrated in FIG. 2A to FIG. 2C may be omitted.

Figure 2E:
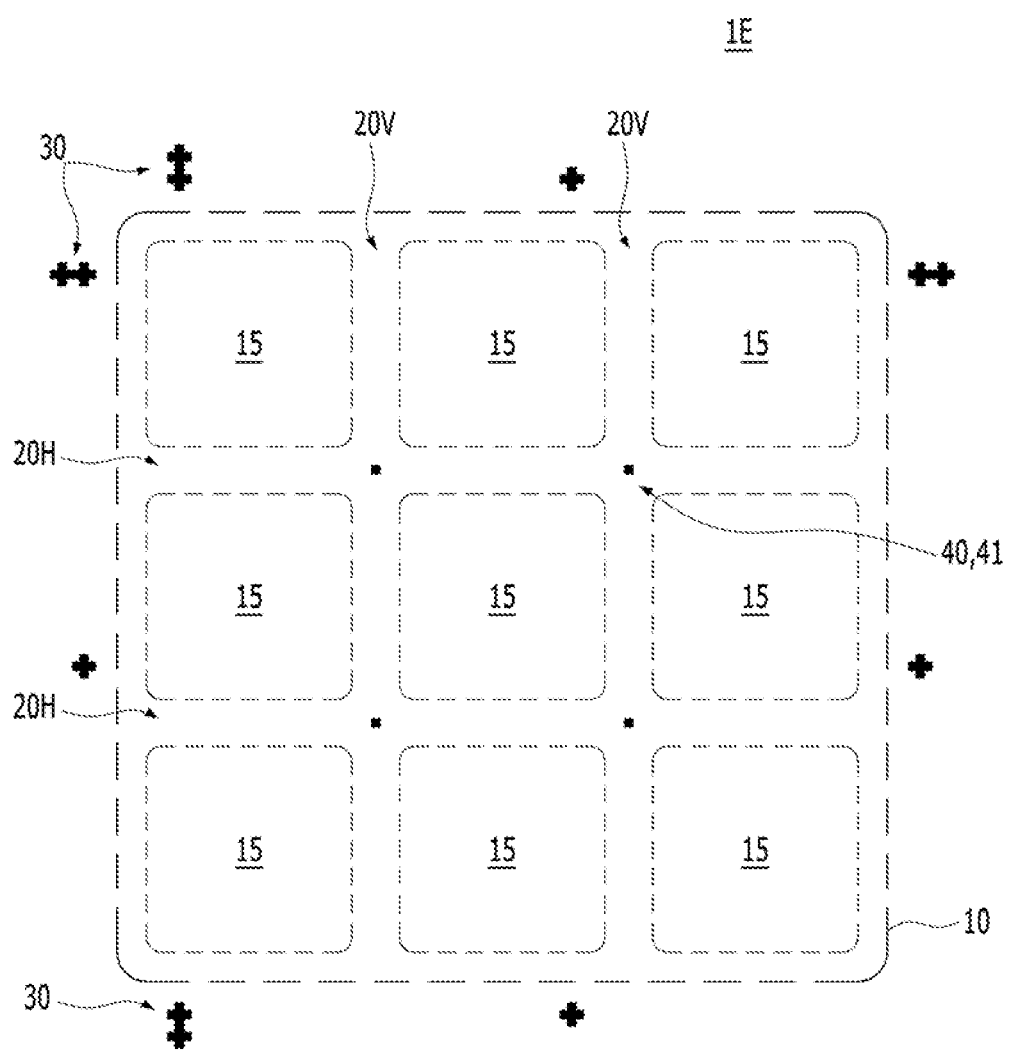

Referring to FIG. 2E, the inner address markers 40 in accordance with one embodiment of the inventive concepts may include only inner block address markers 41 having a dot or block shape. For example, the inner pixel address markers 43 illustrated in FIG. 2A to FIG. 2C may be omitted.

Figure 2F:
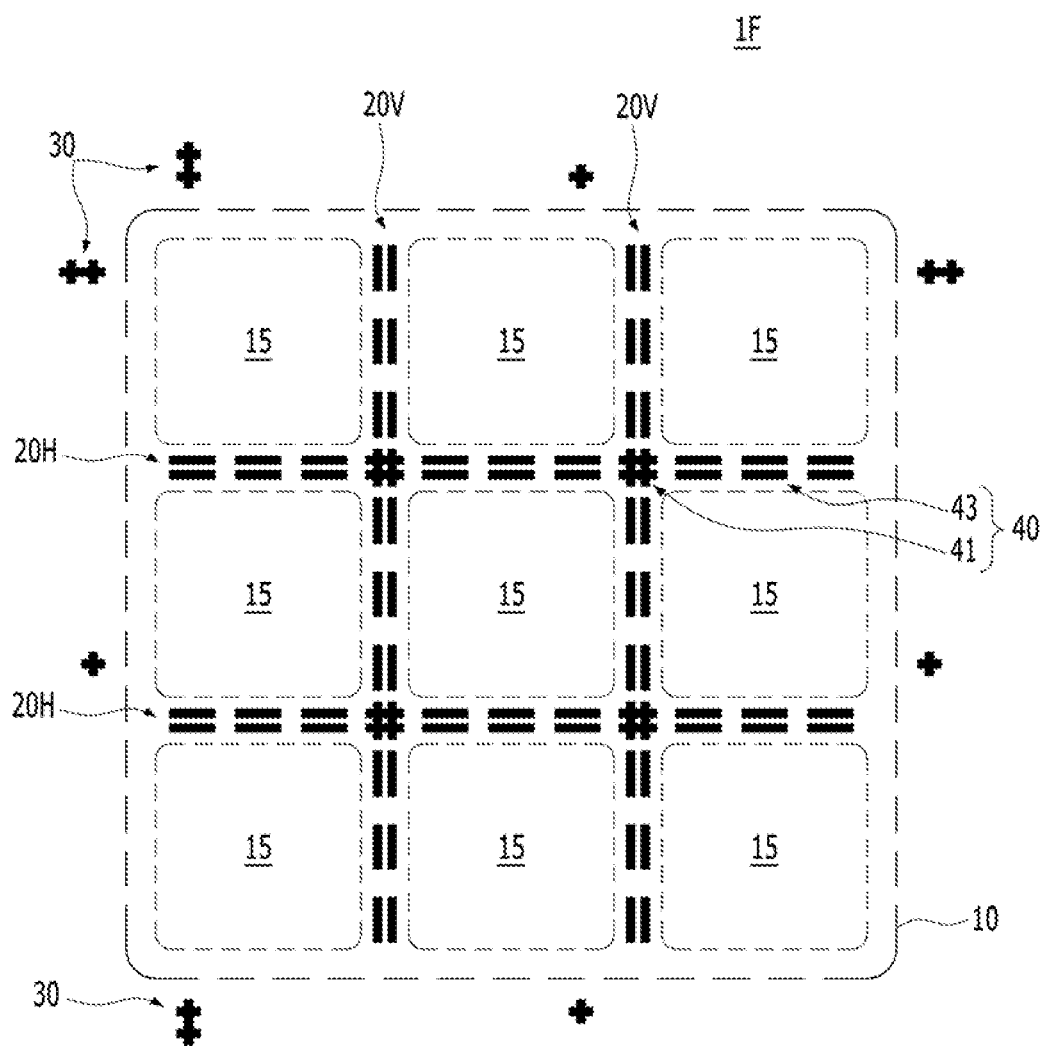

Referring to FIG. 2F, the inner address markers 40 in accordance with one embodiment of the inventive concepts may have a shape of double bars parallel to each other or a pound sign (#) shape.

FIG. 3A to FIG. 3E are layouts of an active layer ATL, a gate layer GTL, a lower metal layer ML1, an upper metal layer ML2, and a microlens layer MLL of the pixel array 1 of an image sensor in accordance with an embodiment of the inventive concepts, respectively.

Figure 3A:
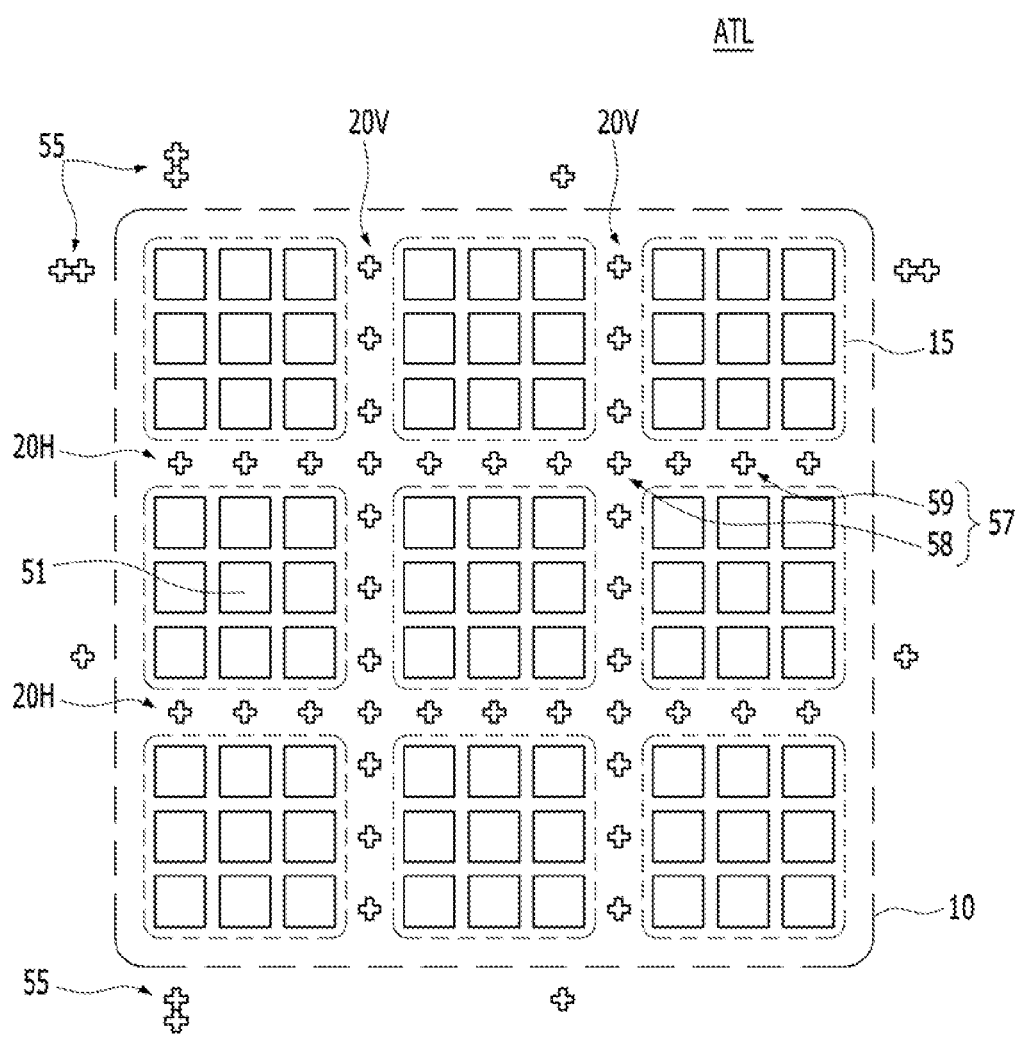
FIG. 3A to FIG. 3E are layouts of an active layer, a gate layer, a lower metal layer, an upper metal layer, and a microlens layer of a pixel array of an image sensor in accordance with embodiments of the inventive concepts, respectively.

Referring to FIG. 3A, the active layer ATL of the pixel array 1 of the image sensor in accordance with an embodiment of the inventive concepts may include outer active address markers 55 around the pixel blocks 15 and inner active address markers 57 disposed in interspaces 20V and 20H between the pixel blocks 15. The inner active address markers 57 may include inner active block address markers 58 disposed at intersections of the vertical interspaces 20V and the horizontal interspaces 20H, and inner active pixel address markers 59 disposed in the vertical interspaces 20V or the horizontal interspaces 20H. The pixel blocks 15 may include a plurality of active regions 51 disposed in a matrix form. The active regions 51 may include a photodiode.

In some embodiments of the inventive concepts, the active layer ATL may be divided into a photodiode layer and a shallow trench isolation (STI) layer. For example, the photodiode layer may include only the active regions 51 and may not include the outer active address markers 55 and/or the inner active address markers 57. The STI layer may include an STI pattern (not shown), the outer active address markers 55, and/or the inner active address markers 57.

Figure 3B:
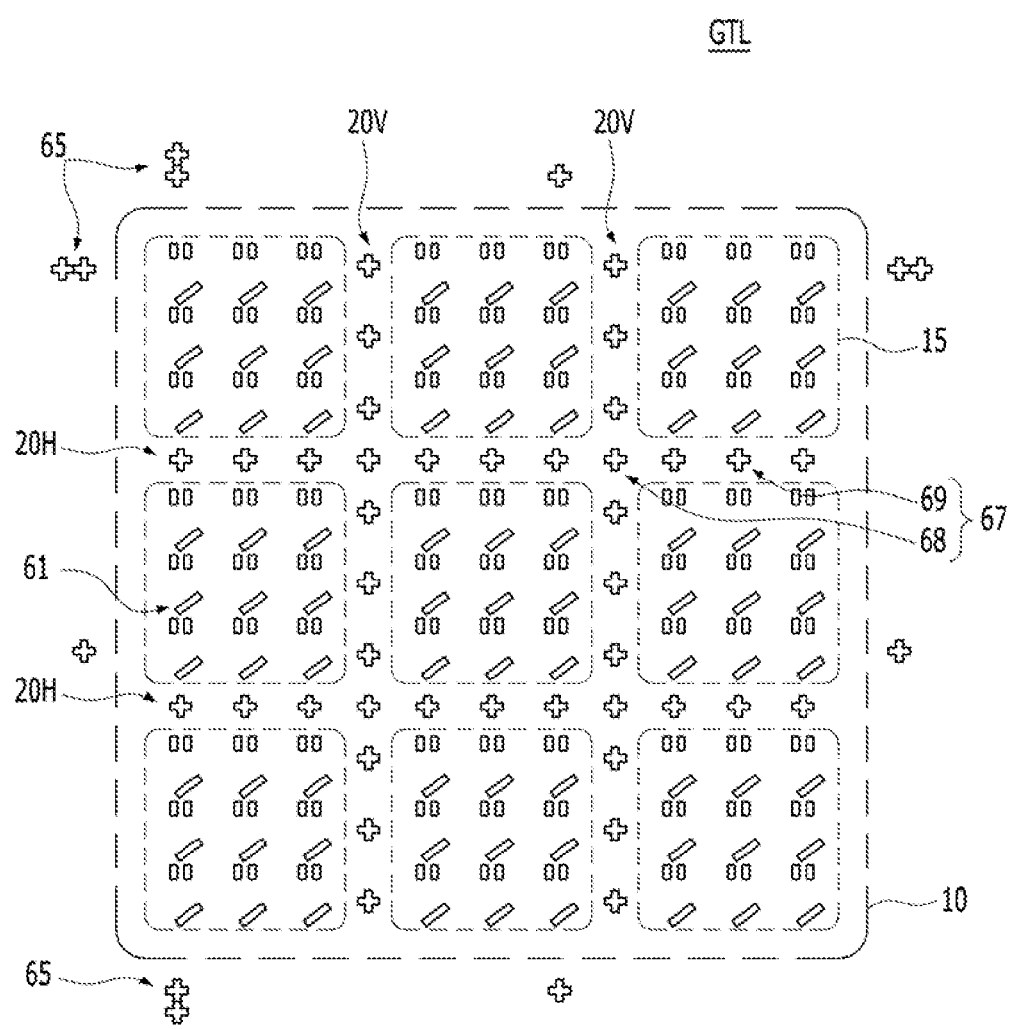

Referring to FIG. 3B, the gate layer GTL of the pixel array 1 of the image sensor in accordance with one embodiment of the inventive concepts may include gate patterns 61 in the pixel blocks 15, outer gate address markers 65 around the pixel blocks 15, and inner gate address markers 67 between the pixel blocks 15. The inner gate address markers 67 may include inner gate block address markers 68 disposed at intersections of the vertical interspaces 20V and the horizontal interspaces 20H, and inner gate pixel address markers 69 disposed in the vertical interspaces 20V or the horizontal interspaces 20H. The gate patterns 61 may correspond to at least one gate electrode of a transfer transistor, a reset transistor, a drive transistor, and a select transistor. Accordingly, the gate patterns 61, the outer gate address markers 65, and the inner gate address markers 67 may be disposed substantially at the same level.

Figure 3C:
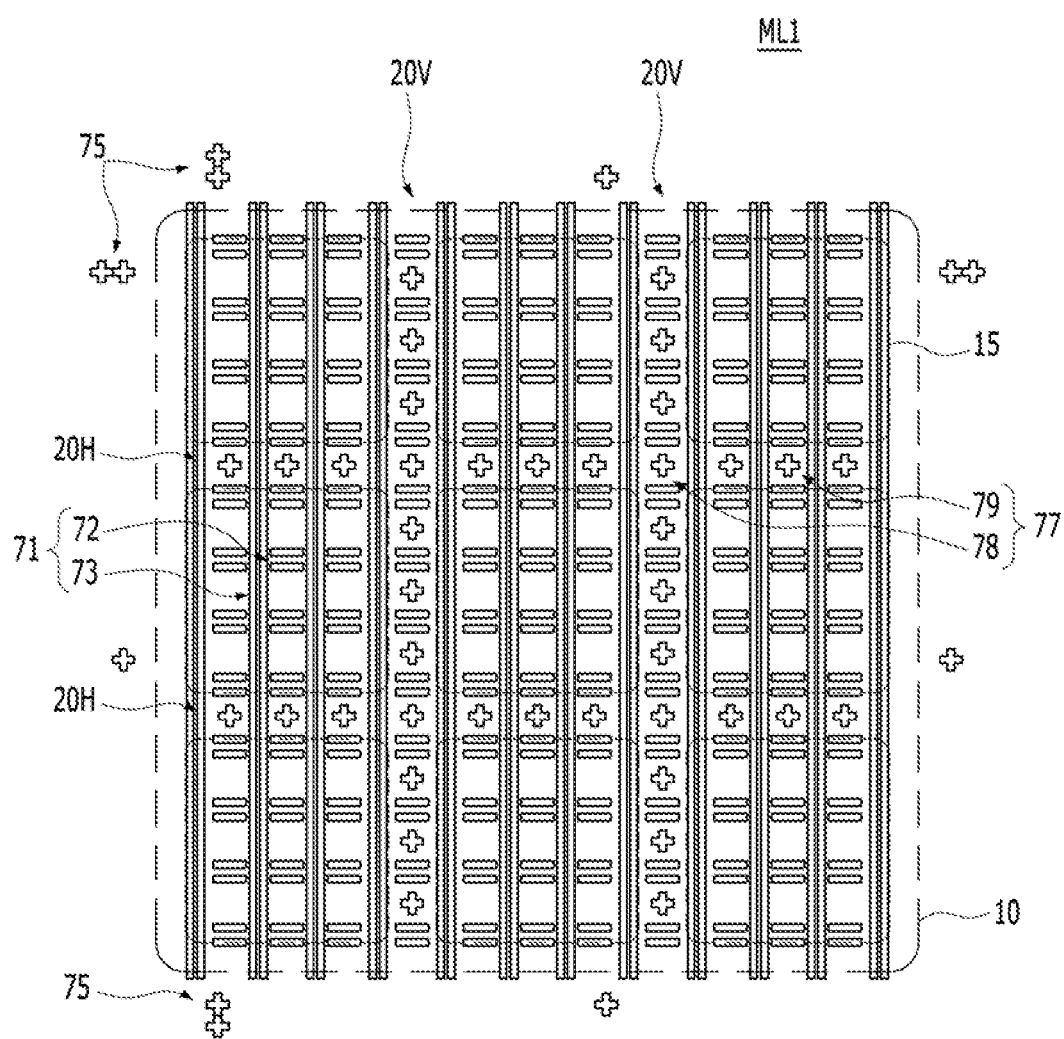

Referring to FIG. 3C, the lower metal layer ML1 of the pixel array 1 of the image sensor in accordance with an embodiment of the inventive concepts may include bar-shaped horizontal lower metal patterns 72 horizontally extending and line-shaped vertical lower metal patterns 73 vertically extending, which overlap the pixel blocks 15, outer lower metal address markers 75 around the pixel blocks 15, and inner lower metal address markers 77 between the pixel blocks 15. The inner lower metal address markers 77 may include inner lower metal block address markers 78 disposed at intersections of the vertical interspaces 20V and the horizontal interspaces 20H, and inner lower metal pixel address markers 79 disposed in the vertical interspaces 20V or the horizontal interspaces 20H. Each of the horizontal lower metal patterns 72 may have a bar shape of two lines which are parallel to each other. The horizontal lower metal patterns 72, the vertical lower metal patterns 73, the outer lower metal address markers 75, and the inner lower metal address markers 77 may be disposed substantially at the same level.

Figure 3D:
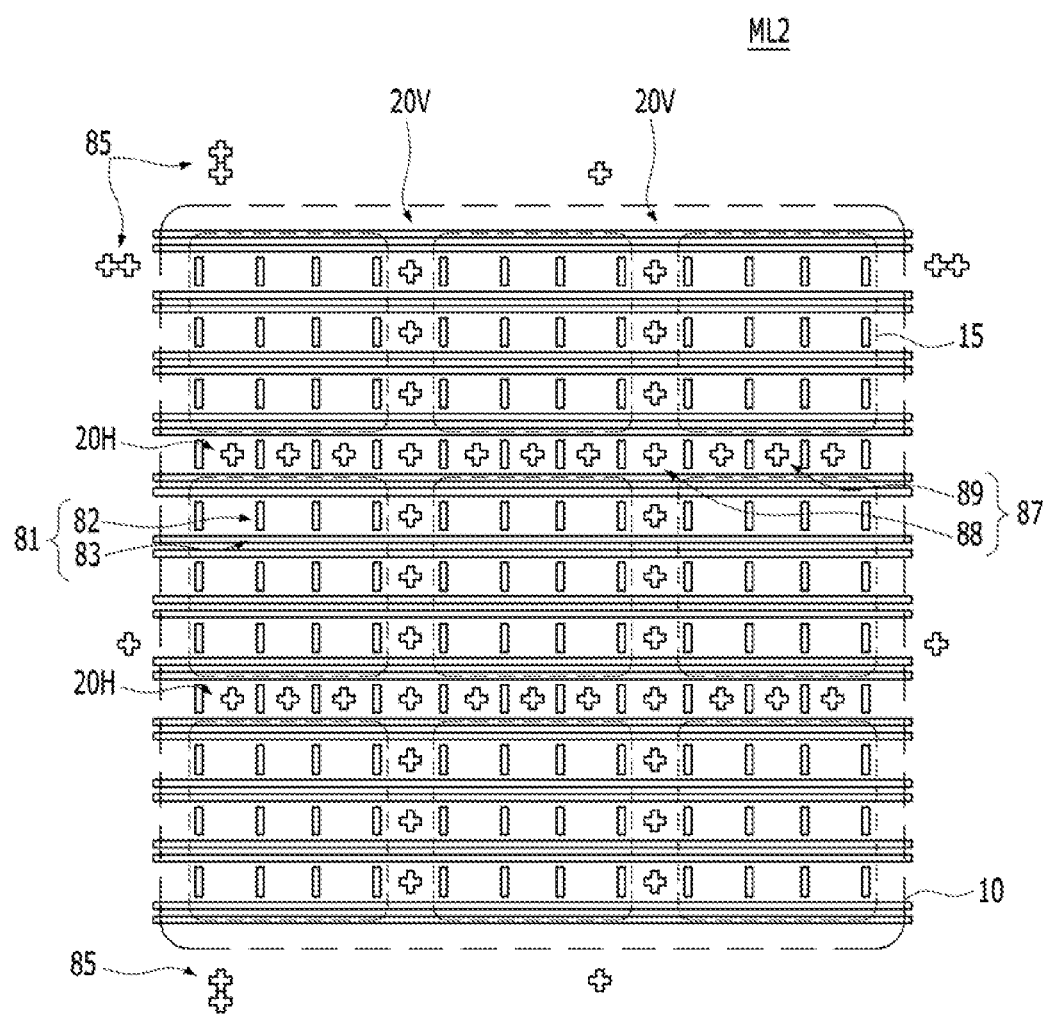

Referring to FIG. 3D, the upper metal layer ML2 of the pixel array 1 of the image sensor in accordance with one embodiment of the inventive concepts may include bar-shaped vertical upper metal patterns 82 vertically extending and line-shaped horizontal upper metal patterns 83 horizontally extending, which overlap the pixel blocks 15, outer upper metal address markers 85 around the pixel blocks 15, and inner upper metal address markers 87 between the pixel blocks 15. The inner upper metal address markers 87 may include inner upper metal block address markers 88 disposed at intersections of the vertical interspaces 20V and the horizontal interspaces 20H, and inner upper metal pixel address markers 89 disposed in the vertical interspaces 20V or the horizontal interspaces 20H. The vertical upper metal patterns 82, the horizontal upper metal patterns 83, the outer upper metal address markers 85, and the inner upper metal address markers 87 may be disposed substantially at the same level.

The inner active address markers 57, the inner gate address markers 67, the inner lower metal address markers 77, and the inner upper metal address markers 87 in accordance with various embodiments of the inventive concepts described with reference to FIG. 3A to FIG. 3D may be selectively omitted. That is, the address markers 57, 67, 77, and 87 are not always formed in all the layers ATL, GTL, ML1, and ML2.

Figure 3E:
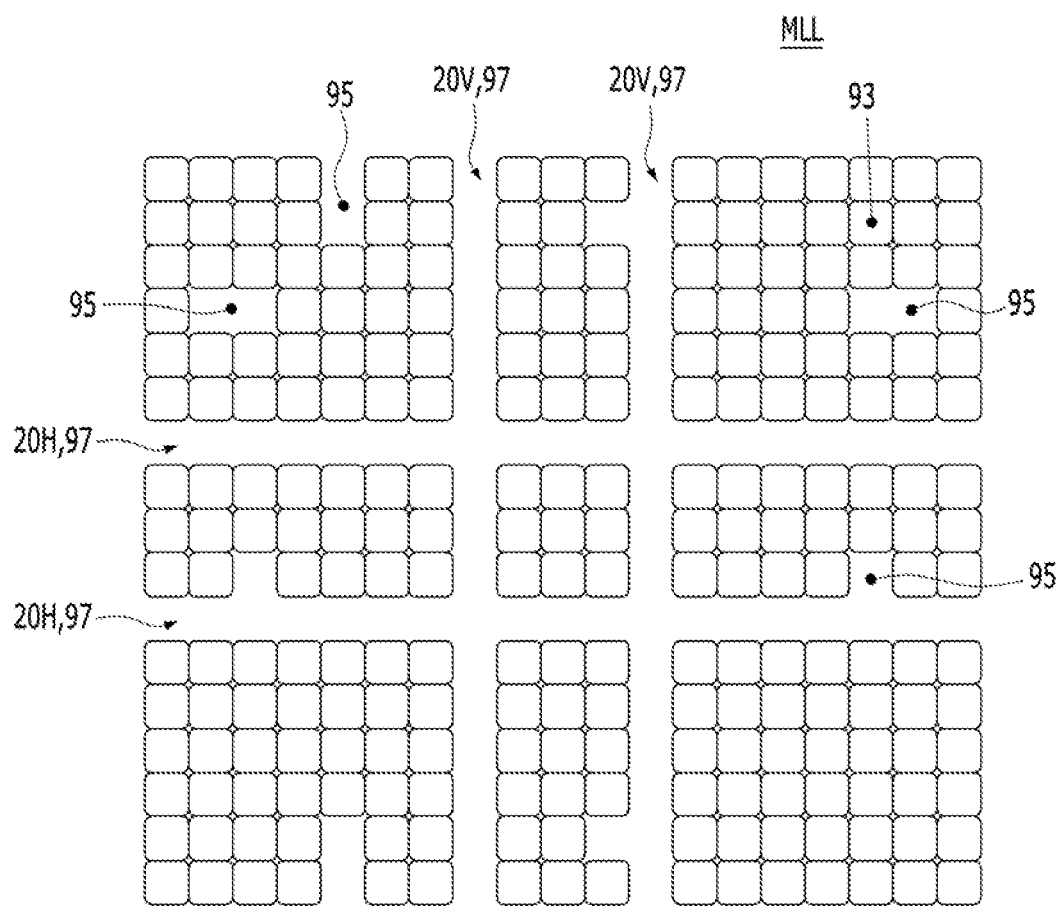

Referring to FIG. 3E, the microlens layer MLL of the pixel array 1 of the image sensor in accordance with one embodiment of the inventive concepts may include a plurality of micro-lenses 93 disposed in a matrix form which overlap and align with the pixel blocks 15, wherein the microlens layer MLL may have vertical interspaces 20V and horizontal interspaces 20H, square-shaped inner non-pattern regions 97 which are overlapped and aligned with the inner address markers 40, and square-shaped outer non-pattern regions 95 which are overlapped and aligned with or adjacent to the outer address markers 30.

For example, the inner non-pattern regions 97 may be overlapped and aligned with the vertical interspaces 20V and the horizontal interspaces 20H, and the outer non-pattern regions 95 may be overlapped and aligned with or adjacent to the outer active address markers 55, the outer gate address markers 65, the outer lower metal address markers 75, and the outer upper metal address markers 85. The outer non-pattern regions 95 and the inner non-pattern regions 97 may be formed by removing some of the microlenses 93 or by not forming the microlenses 93. Accordingly, even after the microlenses 93 are formed, the outer address markers 30 and the inner address markers 40 may be easily recognized.

The outer non-pattern regions 95 may have different shapes according to the lengths, widths, and sizes of the outer address markers 30. For example, outer non-pattern regions 95 having two cross shapes and which are overlapped and aligned with the outer address markers 30 may have shapes obtained by removing a larger number of microlenses 93 as compared with outer non-pattern regions 95 having one cross shape. The microlens layer MLL may have a layout substantially equal to that of a color filter layer. Accordingly, the pixel array 1 of the image sensor in accordance with some embodiments of the inventive concepts may further include a color filter layer having a layout substantially equal to that of the microlens layer MLL. In some embodiments of the inventive concepts, the outer non-pattern regions 95 and the inner non-pattern regions 97 may be formed by removing some of color filters or by not forming the color filters.

Figure 4A:
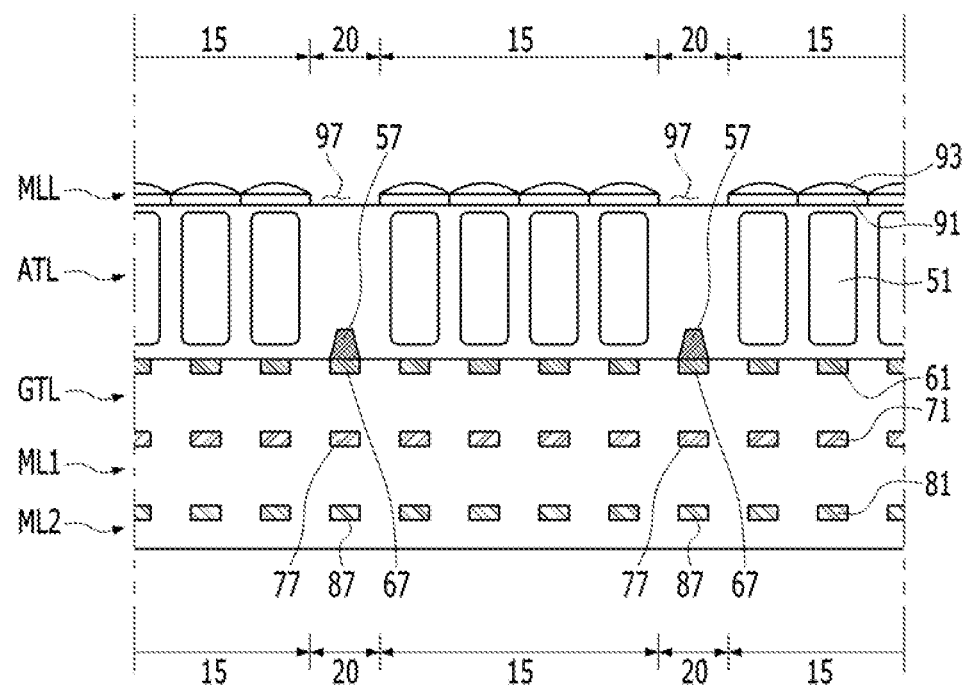
FIG. 4A and FIG. 4B are sectional views of pixel arrays of image sensors in accordance with embodiments of the inventive concepts, which are obtained by cutting along line I-I' of FIG. 2A.
Figure 4B:
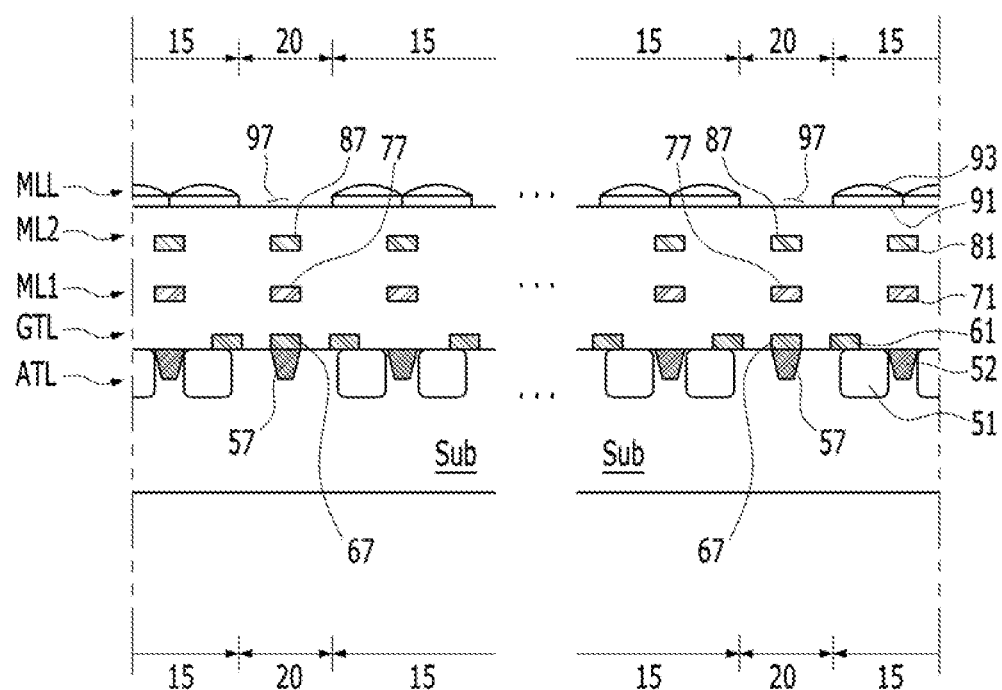

FIG. 4A and FIG. 4B are sectional views of pixel arrays of image sensors in accordance with embodiments of the inventive concepts.

Referring to FIG. 4A, an image sensor in accordance with an embodiment of the inventive concepts may include a backside illumination image sensor (BIS). Specifically, the image sensor may include the active layer ATL, the gate layer GTL, the lower metal layer ML1, the upper metal layer ML2, and the microlens layer MLL.

The active layer ATL may include the active regions 51 in the pixel blocks 15 in a substrate Sub, and the inner active address markers 57 in the interspaces 20. The active regions 51 may include a photodiode. The inner active address markers 57 may be disposed in the substrate Sub to have an STI shape. In some embodiments of the inventive concepts, STI patterns (not shown) may be further disposed between the active regions 51. Accordingly, the inner active address markers 57 and the STI patterns may include substantially the same material and may be disposed substantially at the same level.

The gate layer GTL may include the gate patterns 61 in the pixel blocks 15 and the inner gate address markers 67 in the interspaces 20. The gate patterns 61 and the inner gate address markers 67 may include substantially the same material and may be disposed substantially at the same level.

The lower metal layer ML1 may include the lower metal patterns 71 in the pixel blocks 15 and the inner lower metal address markers 77. The lower metal patterns 71 and the inner lower metal address markers 77 may include substantially the same material and may be disposed substantially at the same level.

The upper metal layer ML2 may include the upper metal patterns 81 in the pixel blocks 15 and the inner upper metal address markers 87. The upper metal patterns 81 and the inner upper metal address markers 87 may include substantially the same material and may be disposed substantially at the same level.

The microlens layer MLL may include the color filters 91 in the pixel blocks 15 and the microlenses 93. In the microlens layer MLL, the color filters 91 and the microlenses 93 may not be disposed in the interspaces 20. That is, in the microlens layer MLL, the inner non-pattern regions 97 may be disposed in the interspaces 20.

The outer active address markers 55, the outer gate address markers 65, the outer lower metal address markers 75, and the outer upper metal address markers 85 may be vertically aligned. The inner non-pattern regions 97 may not be aligned vertically with the outer active address markers 55, the outer gate address markers 65, the outer lower metal address markers 75, and the outer upper metal address markers 85. For example, the inner non-pattern regions 97 may be disposed adjacent to the outer active address markers 55, the outer gate address markers 65, the outer lower metal address markers 75, and the outer upper metal address markers 85.

The inner active address markers 57, the inner gate address markers 67, the inner lower metal address markers 77, the inner upper metal address markers 87, and the inner non-pattern regions 97 may be vertically aligned with each other.

Referring to FIG. 4B, an image sensor in accordance with an embodiment of the inventive concepts may include a frontside illumination image sensor (FIS). Specifically, the image sensor may include the active layer ATL, the gate layer GTL, the lower metal layer ML1, the upper metal layer ML2, and the microlens layer MLL.

The active layer ATL may include the active regions 51 in the pixel blocks 15, the STI patterns 52 between the active regions 51, and the inner active address markers 57 in the interspaces 20. The active regions 51 may include a photodiode. The inner active address markers 57 may include an STI shape.

The gate layer GTL may include the gate patterns 61 in the pixel blocks 15 and the inner gate address markers 67 in the interspaces 20. The lower metal layer ML1 may include the lower metal patterns 71 in the pixel blocks 15 and the inner lower metal address markers 77. The upper metal layer ML2 may include the upper metal patterns 81 in the pixel blocks 15 and the inner upper metal address markers 87.

The microlens layer MLL may include the color filters 91 and the microlenses 93 in the pixel blocks 15. In the microlens layer MLL, the color filters 91 and the microlenses 93 may not be disposed in the interspaces 20. That is, in the microlens layer MLL, the inner non-pattern regions 97 may be disposed in the interspaces 20.

The inner active address markers 57, the inner gate address markers 67, the inner lower metal address markers 77, the inner upper metal address markers 87, and the inner non-pattern regions 97 may be vertically aligned with each other.

Figure 5:
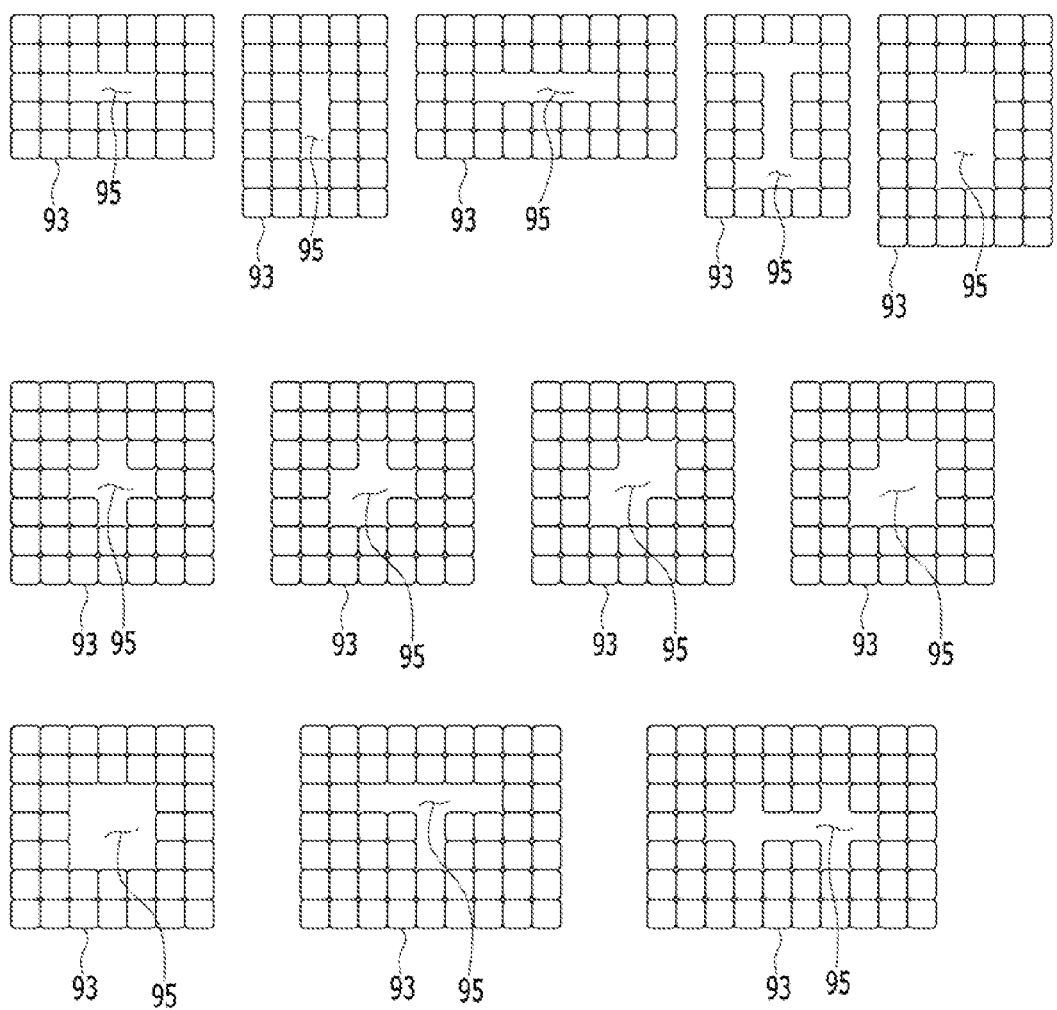
FIG. 5 is a layout conceptually illustrating outer non-pattern regions of a microlens layer of an image sensor in accordance with an embodiment of the inventive concepts.

FIG. 5 is a layout conceptually illustrating the outer non-pattern regions 95 of the microlens layer MLL of the image sensor in accordance with an embodiment of the inventive concepts.

Referring to FIG. 5, the outer non-pattern regions 95 of the microlens layer MLL of the image sensor in accordance with one embodiment of the inventive concepts may have various geometrical shapes. As described above, the outer non-pattern regions 95 may include empty areas which are formed by removing the microlenses 93 in various shapes. The outer non-pattern regions 95 may be positioned in a uniform manner and in a repeated manner according to the pixel blocks 15 or the number of pixels.

Figure 6:
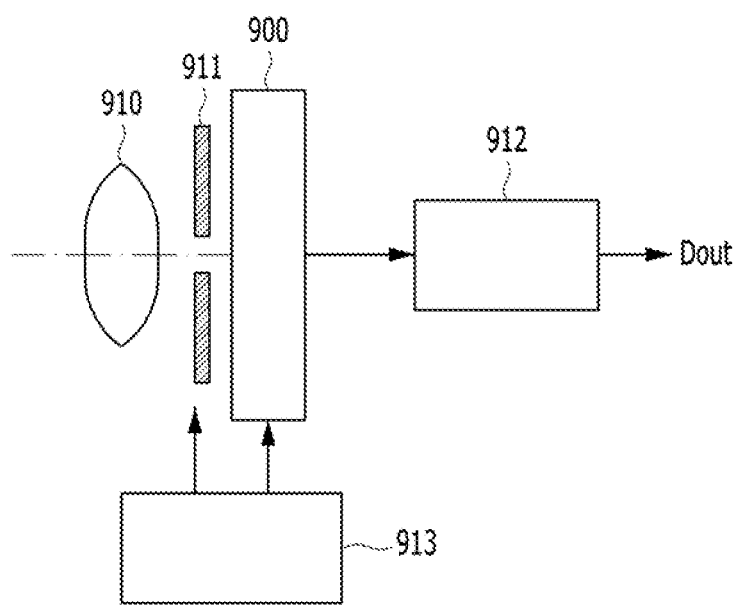
FIG. 6 is a diagram schematically illustrating an electronic device including one or more of image sensors having a pixel array in accordance with various embodiments of the inventive concepts.

FIG. 6 is a diagram schematically illustrating an electronic device including an image sensor in accordance with an embodiment of the inventive concepts.

Referring to FIG. 6, the electronic device may include a camera capable of capturing a still image or a moving image.

The electronic device may include an optical system or an optical lens 910, a shutter unit 911, a driving unit 913 that controls and drives an image sensor 900 and the shutter unit 911, and a signal processing unit 912.

The optical system 910 guides image light that is, incident light from an object to the pixel array 1 of the image sensor 900. The optical system 910 may include a plurality of optical lenses. The shutter unit 911 controls light irradiation periods and shielding periods for the image sensor 900. The driving unit 913 controls a transmission operation of the image sensor 900 and a shutter operation of the shutter unit 911. The signal processing unit 912 performs various types of signal processing with respect to signals outputted from the image sensor 900. After the signal processing an image signal Dout is stored in a storage medium such as a memory or is outputted to a monitor and the like.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
an active layer including pixel blocks and an interspace, wherein the pixel blocks are arranged in a matrix form, wherein the interspace is provided between the pixel blocks;
an outer active address marker located outside the active layer; and
an inner active address marker located in the active layer and in the interspace,
wherein the outer active address marker indicates start positions, end positions, or specific positions of the pixel blocks, and
wherein the inner active address marker distinguishes the pixel blocks from one another.

2. The image sensor of claim 1,
wherein the interspace comprises a vertical interspace and a horizontal interspace, wherein the vertical interspace vertically extends through the active layer, and
wherein the horizontal interspace horizontally extends through the active layer.

3. The image sensor of claim 2,
wherein the inner active address marker comprises an inner active block address marker and an inner active pixel address marker,
wherein the inner active block address marker is located at an intersection of the vertical interspace and the horizontal interspace, and
wherein the inner active pixel address marker is located at least one of at the vertical interspace or the horizontal interspace.

4. The image sensor of claim 3, wherein the inner active block address marker has a shallow trench isolation pattern shape.

5. The image sensor of claim 3, further comprising:
a gate layer formed over the active layer and including a gate pattern;
an inner gate block address marker formed in the gate layer and aligned with the inner active block address marker; and
an inner gate pixel address marker formed in the gate layer and aligned with the inner active pixel address marker,
wherein each of the inner gate block address marker and the inner gate pixel address marker is located substantially at the same level as the gate pattern.

6. The image sensor of claim 3, further comprising:
a metal layer formed over the active layer and including a metal pattern;
an inner metal block address marker formed in the metal layer and aligned with the inner active block address marker; and
an inner metal pixel address marker formed in the metal layer and aligned with the inner active pixel address marker,
wherein each of the inner metal block address marker and the inner metal pixel address marker is located substantially at the same level as the metal pattern.

7. The image sensor of claim 1, further comprising:
a micro-lens layer formed over the active layer and including a pattern region and a non-pattern region; and
micro-lenses disposed in the pattern region in a matrix form,
wherein the non-pattern region includes an outer non-pattern region and an inner non-pattern region,
wherein the outer non-pattern region is aligned with the outer active address marker, and
wherein the inner non-pattern region is aligned with the inner active address marker.

8. The image sensor of claim 7, further comprising:
a color filter layer formed between the micro-lens layer and the active layer and including a filter region and non-filter region; and
color filters disposed on the filter region in a matrix form and not disposed on the non-filter region,
wherein the non-filter region includes an outer non-filter region and an inner non-filter region,
wherein the outer non-filter region is aligned with the outer non-pattern region and the outer address marker, and
wherein the inner non-filter region is aligned with the inner non-pattern region and the inner address marker.

9. An image sensor comprising:
pixel blocks and interspaces between the pixel blocks;
an active region, a shallow trench isolation (STI) region, a gate pattern, and a metal pattern;
outer address markers around the pixel blocks; and
inner address markers disposed in the interspaces,
wherein the outer address marker indicates start positions, end positions, or specific positions of the pixel blocks, and
wherein the inner address marker distinguishes the pixel blocks from one another.

10. The image sensor of claim 9,
wherein the inner address markers comprise inner active address markers, inner gate address markers, and inner metal address markers vertically aligned with one another.

11. The image sensor of claim 10, further comprising:
microlenses disposed in the pixel blocks;
an inner non-pattern region which is not vertically aligned with the inner active address markers, the inner gate address markers, and the inner metal address markers.

12. The image sensor of claim 9,
wherein the outer address markers comprise outer active address markers, outer gate address markers, and outer metal address markers vertically aligned with one another.

13. The image sensor of claim 12, further comprising:
an outer non-pattern region which is not vertically aligned with the outer active address markers, the outer gate address markers, and the outer metal address markers.

* * * * *